United States Patent
Singh et al.

(10) Patent No.: US 11,423,978 B2
(45) Date of Patent: *Aug. 23, 2022

(54) WRITE ASSIST FOR A MEMORY DEVICE AND METHODS OF FORMING THE SAME

(71) Applicant: Taiwan Semiconductor Manufacturing Company Limited, Hsinchu (TW)

(72) Inventors: Sahil Preet Singh, Hsinchu (TW); Yen-Huei Chen, Hsinchu County (TW); Hung-Jen Liao, Hsinchu (TW)

(73) Assignee: Taiwan Semiconductor Manufacturing Company Limited, Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/203,815

(22) Filed: Mar. 17, 2021

(65) Prior Publication Data

US 2021/0201991 A1    Jul. 1, 2021

Related U.S. Application Data

(63) Continuation of application No. 16/734,651, filed on Jan. 6, 2020, now Pat. No. 10,971,220, which is a
(Continued)

(51) Int. Cl.
*G11C 11/419* (2006.01)
*G11C 11/412* (2006.01)
(Continued)

(52) U.S. Cl.
CPC ............ *G11C 11/419* (2013.01); *G11C 5/147* (2013.01); *G11C 5/148* (2013.01); *G11C 7/1009* (2013.01);
(Continued)

(58) Field of Classification Search
CPC ....... G11C 11/419; G11C 5/147; G11C 5/148; G11C 7/1009; G11C 7/12; G11C 11/4097;
(Continued)

(56) References Cited

U.S. PATENT DOCUMENTS 7,453,126 B2    11/2008 Ishii
7,502,275 B2    3/2009 Nil et al.
(Continued)

FOREIGN PATENT DOCUMENTS

CN           101853698 A        10/2010
JP        2000222883 A    *   8/2000      ............. G11C 15/00
(Continued)

OTHER PUBLICATIONS

Allen, Phillip, Holberg, Douglas; CMOS Analog Circuit Design; Saunders College Publishing; pp. 230-233; 1987.

*Primary Examiner* — Fernando Hidalgo
(74) *Attorney, Agent, or Firm* — Jones Day

(57) ABSTRACT

A semiconductor memory device includes an array of memory cells arranged in a plurality of rows and columns, with each memory cell including a plurality of bit cell transistors. The semiconductor memory device further includes a plurality of write assist circuits, including one or more write assist circuits within each column of the array of memory cells, each write assist circuit configured to provide a core voltage to memory cells within the same column and to reduce the core voltage during a write operation. The array of memory cells and the plurality of write assist circuits have a common semiconductor layout.

20 Claims, 11 Drawing Sheets

Related U.S. Application Data continuation of application No. 16/435,663, filed on Jun. 10, 2019, now Pat. No. 10,529,415, which is a continuation of application No. 16/021,172, filed on Jun. 28, 2018, now Pat. No. 10,319,435.

(60) Provisional application No. 62/551,838, filed on Aug. 30, 2017.

(51) Int. Cl.

| | | |
|---|---|---|
| *G11C 11/4097* | (2006.01) | |
| *G11C 7/10* | (2006.01) | |
| *H01L 29/78* | (2006.01) | |
| *G11C 5/14* | (2006.01) | |
| *H01L 27/02* | (2006.01) | |
| *H01L 27/12* | (2006.01) | |
| *G11C 11/413* | (2006.01) | |
| *G11C 7/12* | (2006.01) | |
| *H01L 27/11* | (2006.01) | |

(52) U.S. Cl.
CPC ............ *G11C 7/12* (2013.01); *G11C 11/4097* (2013.01); *G11C 11/412* (2013.01); *G11C 11/413* (2013.01); *H01L 27/0207* (2013.01); *H01L 27/1211* (2013.01); *H01L 29/785* (2013.01); *H01L 27/1104* (2013.01)

(58) Field of Classification Search
CPC . G11C 11/412; G11C 11/413; H01L 27/0207; H01L 27/1211; H01L 29/785; H01L 27/1104
USPC ........................................................ 365/154
See application file for complete search history.

(56) References Cited

U.S. PATENT DOCUMENTS

| | | |
|---|---|---|
| 8,183,516 B2 | 5/2012 | Augusto |
| 9,305,633 B2 | 4/2016 | Grover et al. |
| 9,812,324 B1 | 11/2017 | Zhuang et al. |
| 9,887,210 B2 | 2/2018 | Song et al. |
| 9,929,156 B2 | 3/2018 | Oh et al. |
| 10,541,243 B2 | 1/2020 | Do et al. |
| 10,615,817 B2 | 4/2020 | Downey |
| 2004/0228176 A1 | 11/2004 | Fujisawa et al. |
| 2006/0262628 A1* | 11/2006 | Nii .................. G11C 11/412 365/226 |
| 2020/0035663 A1 | 1/2020 | Becker |
| 2020/0035689 A1 | 1/2020 | Lu et al. |

FOREIGN PATENT DOCUMENTS

| | | |
|---|---|---|
| KR | 20130032263 | 4/2013 |
| KR | 20130063440 | 6/2013 |

* cited by examiner

WRITE ASSIST FOR A MEMORY DEVICE AND METHODS OF FORMING THE SAME

CROSS-REFERENCE TO RELATED APPLICATION

This application is a continuation application of U.S. patent application Ser. No. 16/734,651, filed Jan. 6, 2020; which is a continuation application of U.S. patent application Ser. No. 16/435,663, filed Jun. 10, 2019, and granted as U.S. Pat. No. 10,529,415; which is a continuation application of U.S. patent application Ser. No. 16/021,172, filed Jun. 28, 2018, and granted as U.S. Pat. No. 10,319,435; which claims priority to U.S. Provisional Patent Application No. 62/551,838, filed on Aug. 30, 2017, all of which are incorporated herein by reference in their entireties.

BACKGROUND

Many electronic devices such as desktop computers, laptop computers, tablets and smart phones employ integrated and/or discrete semiconductor memory devices to store information. These semiconductor memory devices fall into either volatile or non-volatile categories. Volatile memories lose stored information when power is removed, while non-volatile memories retain their stored information even when power is removed. Volatile memories include random access memory (RAM), which is further divided into subcategories including static random access memory (SRAM) and dynamic random access memory (DRAM).

A typical DRAM memory cell has only one transistor and one capacitor, so it provides a high degree of integration for bulk information storage; however, DRAM requires constant refreshing and its slow speed tends to limit DRAM to computer main memories. On the other hand, an SRAM cell design, such as a 4 transistor design (4T) or a 6 transistor design (6T), uses more transistors to make the SRAM cell bi-stable, meaning that the SRAM cell maintains a binary output state indefinitely, as long as adequate power is supplied. While SRAM has a lower degree of integration than DRAM, SRAM can operate at a higher speed and with lower power dissipation than DRAM, so computer cache memories tend to use SRAMs. Other SRAM applications include embedded memories and networking equipment memories. While SRAM is often selected over DRAM when faster performance is important, even faster SRAM performance is desirable.

It is not uncommon for SRAM transistors, such as SRAM transistors included in a memory cell array, to be implemented on the same integrated circuit as other transistor types used, for example, for logic or input/output (IO) circuitry. However, the design rules for SRAM transistors are typically different from (e.g., tighter than) the design rules used for typical logic/IO transistors. Because SRAM design rules are tighter, SRAM transistors are typically smaller than logic/IO transistors. A typical logic/IO transistor therefore takes up more space on an integrated circuit than a typical SRAM transistor. In addition, when SRAM transistors are implemented on the same integrated circuit as logic/IO transistors having different design rules, the logic/IO transistors are typically separated from the SRAM transistors on the integrated circuit by a buffer area, requiring additional space on the integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
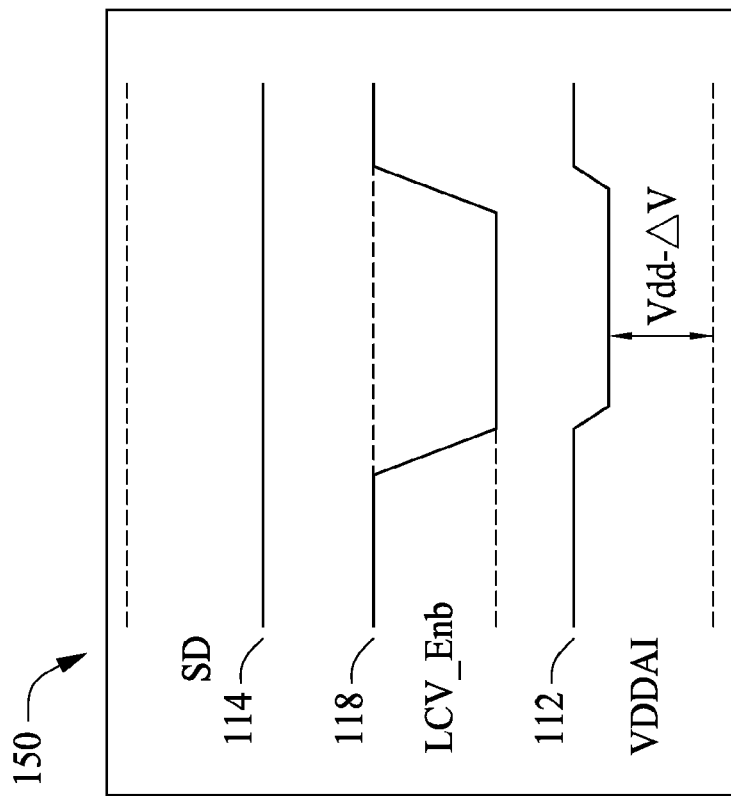
FIG. 1B is a signal waveform diagram showing an example operation of the LCV write assist circuit of FIG. 1A.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For certain memory devices, such as SRAM, a reduced power supply voltage (i.e., lower CVVD voltage "LCV"), as compared to a nominal supply voltage, produced by supply voltage circuitry, shortens write data operation cycle time, resulting in faster writing speed. As long as the reduced supply voltage is not decreased so much as to impact signal integrity, noise margins, etc., thereby interfering with the integrity of a write data operation, the smaller transition between logical low and logical high voltage values associated with the reduced supply voltage range correspondingly take less time. Many LCV write assist circuits, however, add significant size to the overall silicon footprint of the integrated circuit.

Figure 1A:
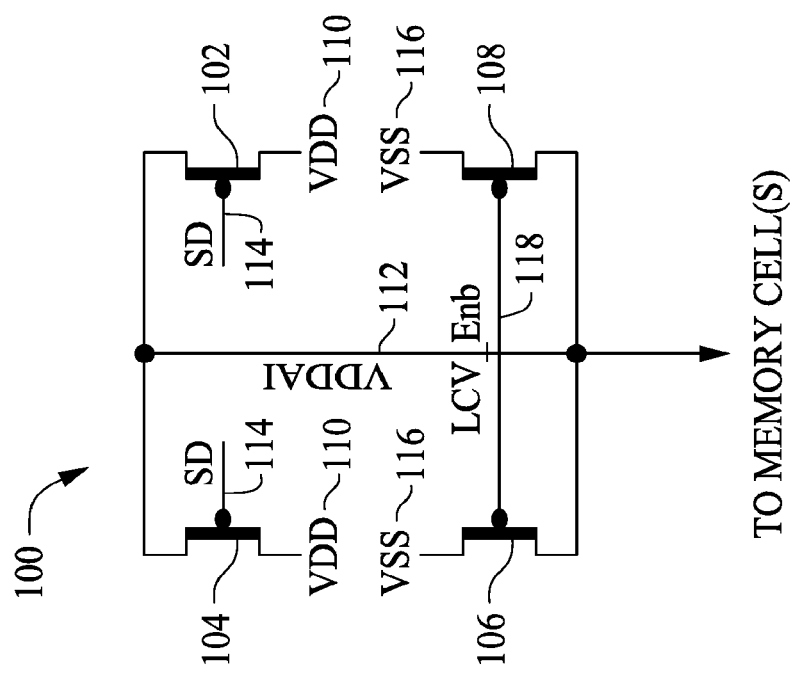
FIG. 1A illustrates an example of an LCV write assist circuit that utilizes SRAM bit cell transistors.

FIG. 1A illustrates an example of an LCV write assist circuit 100 that utilizes SRAM bit cell transistors. The LCV write assist circuit 100 includes four SRAM transistors 102, 104, 106, 108 that operate to lower the SRAM core voltage (VDDAI) during write operations, as illustrated by the example signal waveform diagram 150 shown in FIG. 1B. The transistors 102, 104, 106, 108 that make up the LCV write assist circuit 100 are SRAM bit cell transistors, utilizing the same semiconductor layout as the bit cells of the SRAM array (see, e.g., FIGS. 7 and 8). The LCV write assist circuit 100 may therefore be implemented within the SRAM array, resulting in an area efficient layout design.

The LCV write assist circuit 100 includes two upper SRAM transistors 102, 104 and two lower SRAM transistors 106, 108. The two upper SRAM transistors 102, 104 each include a first current-carrying terminal coupled to the SRAM pull-up voltage (Vdd) 110 and a second current-carrying terminal coupled to an SRAM core voltage bus (VDDAI) 112. The gate terminals of the two upper SRAM transistors 102, 104 are each coupled to the shut-down (SD) pin 114 of the SRAM. The two lower SRAM transistors 106, 108 each include a first current-carrying terminal coupled to the SRAM core voltage bus (VDDAI) 112 and a second current-carrying terminal coupled to the SRAM pull-down voltage (Vss) 116. The pull-down voltage (Vss) 116 may, for example, be a ground potential. The gate terminals of the two lower SRAM transistors 106, 108 are each coupled to an LCV enable signal 118. The SRAM core voltage bus (VDDAI) 112 is provided to one or more memory cells within the SRAM array. For example, LCV write assist circuits 100 may be utilized to provide a separate core voltage bus (VDDAI) 112 to each bit cell column within an SRAM array, as described in more detail below with reference to the examples set forth in FIGS. 2-5.

The operation of the LCV write assist circuit 100 is illustrated in FIG. 1B. As shown, the LCV write assist circuit 100 operates as a voltage divider to pull down the SRAM core voltage (VDDAI) 112 during write operations. Specifically, the SD signal 114 at the gate terminals of the upper SRAM transistors 102, 104 is tied low during normal operations, electrically connecting Vdd 110 to VDDAI 112 through the current-carrying terminals of the upper SRAM transistors 102, 104. The LCV enable signal 118 is normally logic high and transitions to a logic low state during a write operation. When the LCV enable signal 118 is in a logic high state, the lower SRAM transistors 106, 108 are off, and the SRAM core voltage (VDDAI) 112 is substantially equal to Vdd. When the LCV enable signal 118 transitions to a logic low state during a write operation, the lower SRAM transistors 106, 108 turn on, creating a voltage divider between Vdd and Vss (a voltage divider is created because Vdd is applied across the series connected upper and lower transistors with the output VDDAI voltage emerging from the connection between the series pairs.) Thus, during a write operation the SRAM core voltage (VDDAI) 112 is equal to the difference between Vdd and the voltage drop (ΔV) across the upper and lower SRAM transistors 102, 104, 106, 108.

The resultant voltage drop (ΔV) in the SRAM core voltage (VDDAI) 112 during write operations will depend on the size of the SRAM transistors 102, 104, 106, 108. For a typical SRAM bit cell transistor layout, this should result in a voltage drop (ΔV) of about 10-15% (it should be understood, however, that other values are also within the scope of the disclosure) In some embodiments, the voltage drop (ΔV) during write assist should be large enough to provide a desired increase to the bit cell switching speed, but should not be so large as to drop the core voltage (VDDAI) below the minimum required for reliable bit cell operation.

In the illustrated embodiments, the shut-down signal (SD) 114 is used to drive the gate terminals of the upper SRAM transistors 102, 104 in the LCV write assist circuit 100. The shut-down signal (SD) 114 remains in a logic low state during normal SRAM operations, and transitions to a logic high state during a device shut-down mode. When a device shut-down mode is triggered, the SD signal 114 will cause the upper SRAM transistors 102, 104 to turn off, cutting off power (Vdd) to VDDAI 112 and thus the SRAM array. Cutting off power to VDDAI 112 in this manner may provide the added advantage of reducing leakage during shut-down mode. In other embodiments, however, the gate terminals of the upper SRAM transistors 102, 104 could instead be tied to a logic low state.

Figure 2:
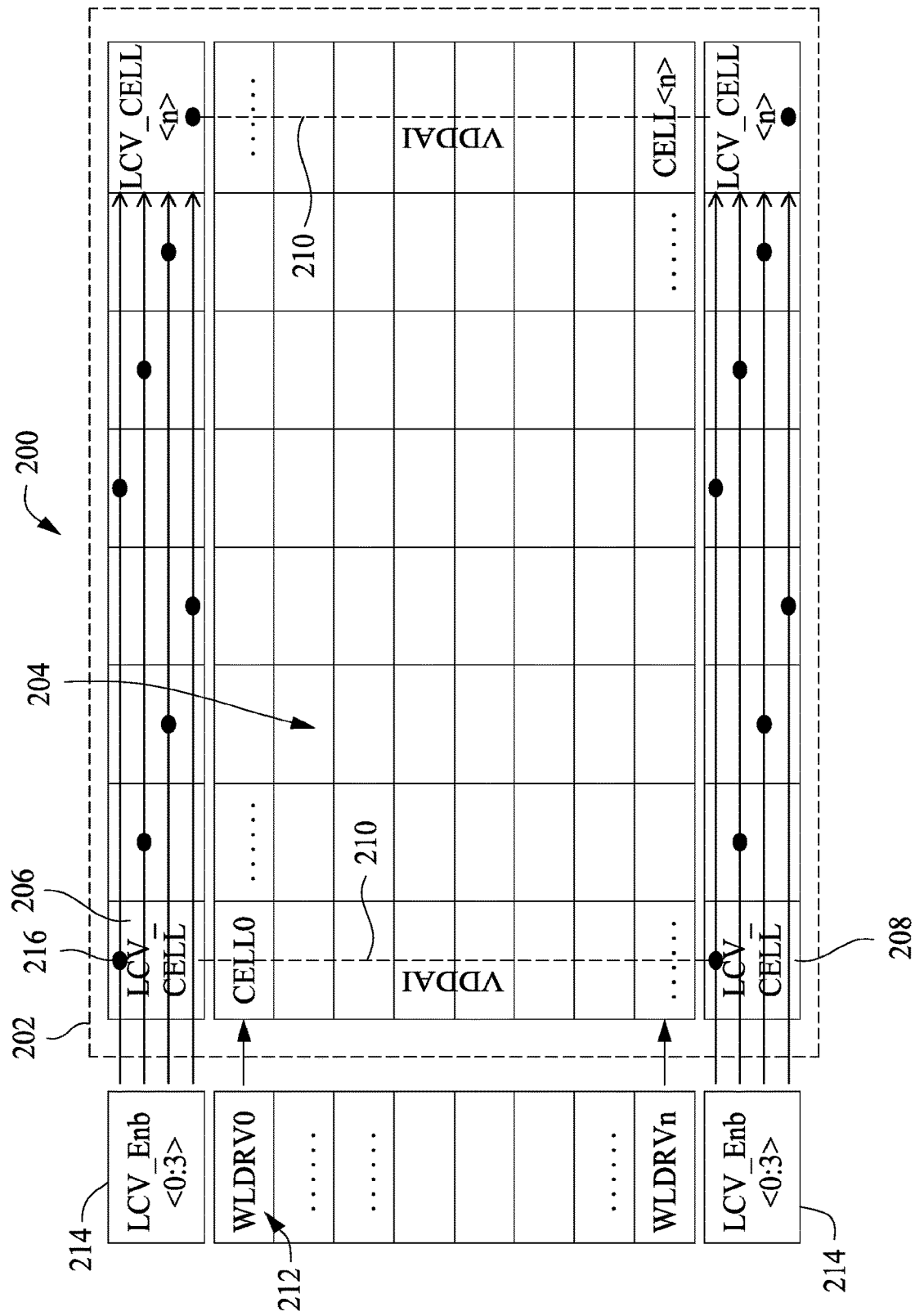
FIG. 2 is an example floorplan diagram of an SRAM with LCV write assist circuitry included within the SRAM array.

FIG. 2 is an example floorplan diagram of an SRAM 200 with LCV write assist circuitry included within the SRAM array 202. The floorplan for the SRAM array 202 is illustrated within the dotted box in FIG. 2. The SRAM array 202 includes an array of memory bit cells 204 (Cell<0>-Cell<n>) that are arranged in n rows and n columns, and that each include a common semiconductor layout (see, e.g., FIGS. 7-10). It should be understood, however, that other SRAM array configurations are also possible, such as an array with n row and m columns. One or more LCV write assist circuit are included within each column of the SRAM array 202. In the illustrated example, each column of the SRAM array 202 includes two LCV write assist circuits (labeled LCV CELL), an upper write assist circuit 206 and a lower write assist circuit 208. Each column of the SRAM array 202 also includes a core voltage (VDDAI) bus 210 that provides the core operating voltage to each of the memory bit cells within the column. For example, VDDAI 210 is provided on a column-wise basis, and there is no Vdd connection providing a core operating voltage directly to the entire array of memory bit cells 204. That is, the VDDAI bus in each column is independent of the VDDAI buses in other columns (i.e., VDDAI is not shorted across columns of the array 204).

The core voltage (VDDAI) bus 210 extends from the upper write assist circuit 206 to the lower write assist circuit 208 within each column of the SRAM array 202. The core voltage (VDDAI) provided to each memory bit cell within a column is controlled by the upper and lower write assist circuits 206, 208 such that VDDAI is reduced during write operations, for example as described above with reference to FIGS. 1A and 1B. Two write assist circuits 206, 208 are provided for each column in the illustrated embodiment in order to provide sufficient power on the VDDAI bus 210 to overcome the resistance and leakage across the entire column of bit cells. It should be understood, however, that other embodiments may utilize more or less write assist circuits for each column of the SRAM array 202. For instance, one embodiment may include four upper write assist circuits and four lower write assist circuits for each bit cell column to provide sufficient column-wise VDDAI power for a large bit cell array 204.

Figure 3B:
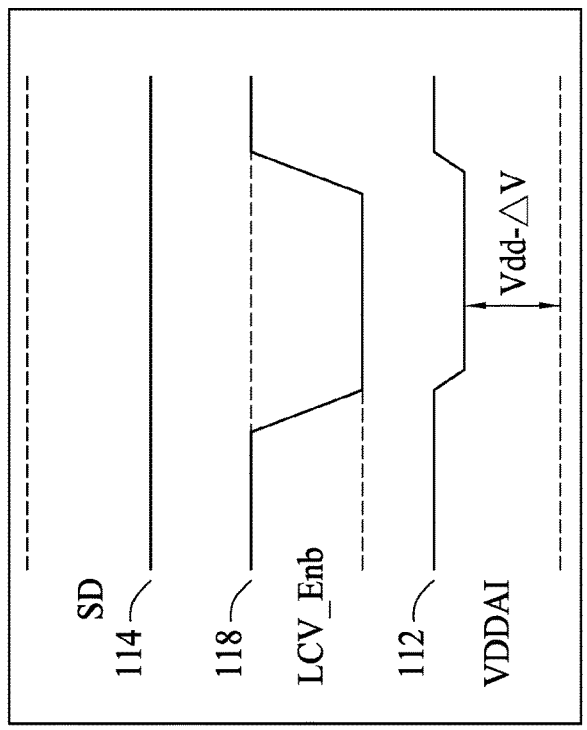
FIG. 3B is a signal waveform diagram showing an example operation of the LCV write assist circuitry in FIG. 3A.

Also illustrated in FIG. 2 are the word line signals 212 (WLDRV0-WLDRVn) for each row of the memory bit cell array 204 and the LCV enable signal 214 (LCV_Enb). The word line signals 212 are used to select a particular row of the bit cell array 204 for a write operation. The LCV enable signal 214 is coupled to the LCV write assist circuits 206, 208 in each column of the SRAM array 202 via a multiplexer (not shown) that is used to selectively couple the LCV enable signal 214 to one or more particular columns at a given time. In the illustrated embodiment, the LCV enable signal 214 is coupled to the upper and lower write assist circuits 206, 208 of each column via a MUX-4 device that selectively couples the LCV enable signal 214 to one of four outputs at a given time, illustrated in FIG. 2 by the four lines extending from each of the LCV enable signal blocks 214 and connecting to the LCV write assist circuits 206, 208. Connections between the four multiplexer outputs for the LCV enable signal 214 and a particular LCV write assist circuit 206, 208 are illustrated by connection nodes 216 in FIG. 2. In the illustrated example, each multiplexer output is connected to the LCV write assist circuit 206, 208 in every fifth column of the array 202. When selected by the MUX-4 for output to the LCV write assist circuits 206, 208 in a particular column, the LCV enable signal 214 causes the core operating voltage 210 (VDDAI) in that column to be reduced during write operations, for example as illustrated in FIGS. 3A and 3B.

It should be understood by persons skilled in the field that the illustrated MUX-4 configuration results in multiple bits (i.e., a bit in every fifth column of the array 200) being written at the same time. For example, in a typical SRAM configuration 32, 64, 128 or more bits may be written during the same write cycle using a MUX-4 configuration. It should also be understood that the example illustrated in FIG. 2 may, in other embodiments, be applied using a MUX-x design (such as MUX-1,2,4 or 8). In these embodiments, the LCV_Enb signal bus would be LCV_ENB<0:x>.

Figure 9:
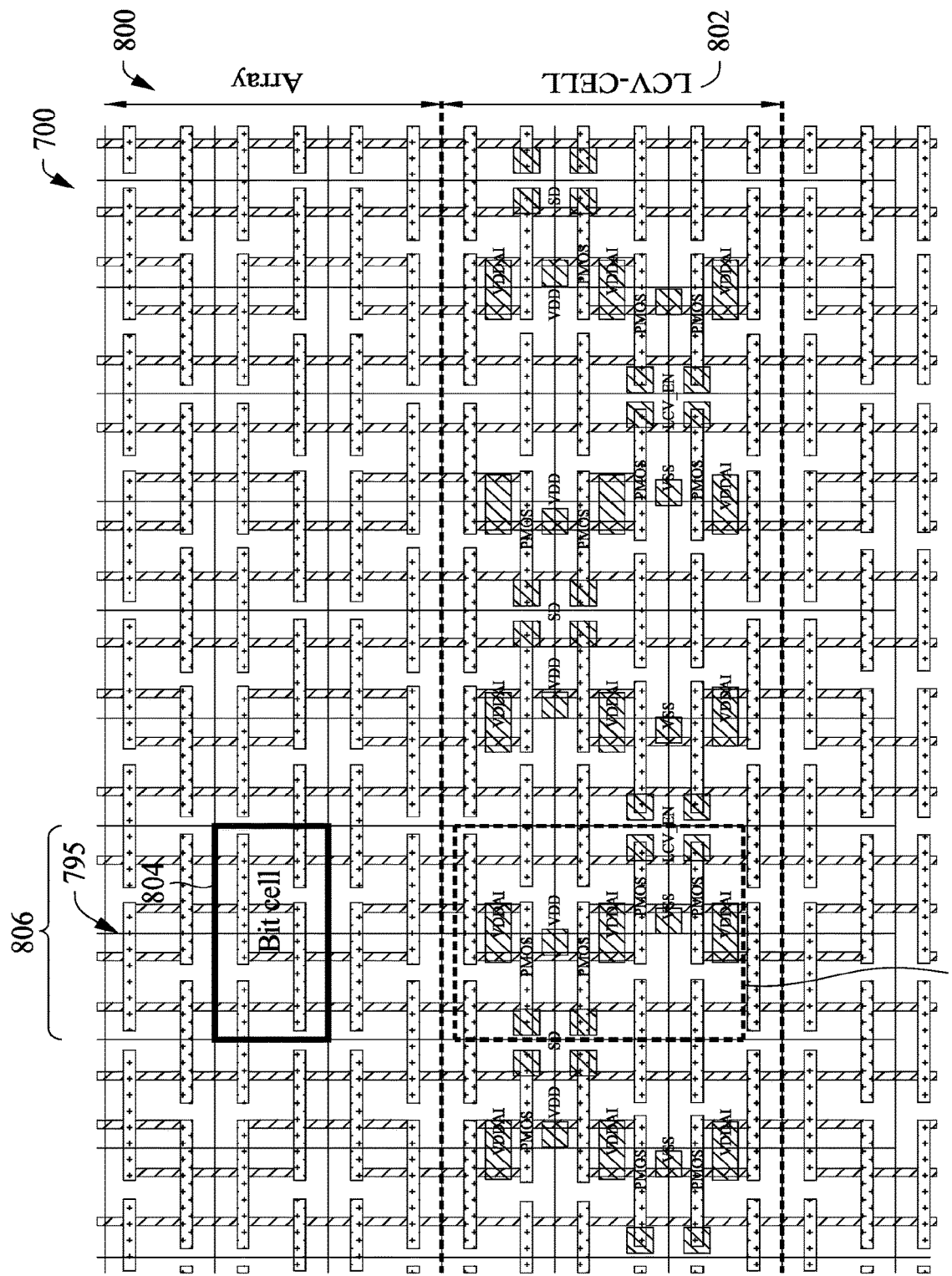
FIG. 9 shows an example of a common semiconductor layout used for both bit cells and LCV write assist circuits in an SRAM array.

In embodiments, the LCV write assist circuits 206, 208 are laid out directly adjacent to the memory bit cells 204, with no buffer area in between (for example as shown in FIG. 9.) This space savings is achievable because both the LCV write assist circuits 206, 208 and the memory bit cells 204 are implemented using SRAM transistors, and thus no buffer area is necessary.

Figure 3A:
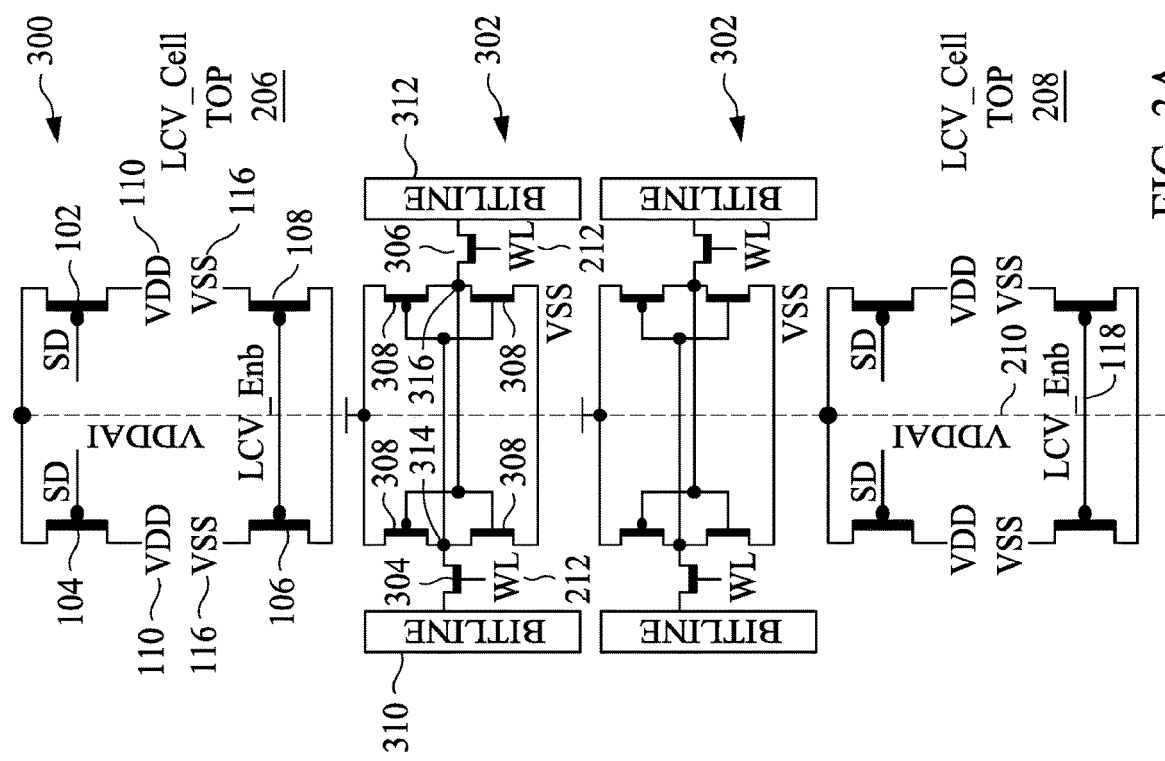
FIG. 3A is a diagram showing an example of a column from the SRAM array of FIG. 2.

FIG. 3A is a diagram showing an example of a column 300 from the SRAM array 200 of FIG. 2. The SRAM array column 300 includes an upper LCV write assist circuit 206 at the top of the column, a lower LCV write assist circuit 208 at the bottom of the column, and a column of memory bit cells 302 between the upper and lower LCV write assist circuits 206, 208. The memory bit cells 302 in the column 300 each receive core voltage from a common VDDAI bus 210 that is supplied through the upper and lower LCV write assist circuits 206, 208. For simplicity, the illustrated example only shows two memory bit cells 302 in the column 300. It should be understood, however, that a memory bit cell column 300 will typically include many more memory bit cells, each coupled to the core voltage bus (VDDAI).

The memory bit cells 302 operate in a conventional manner to store bits of data, with write access to the memory bit cells 302 being controlled using word line (WL) and bit line (BL) signals, as illustrated. In the illustrated example, the memory bit cells 302 are six transistor (6T) cells that include two pass-gate transistors 304, 306 and four bit cell transistors 308 configured in a latch structure (it should be understood, however, that other types of SRAM/memories are also within the scope of the disclosure). The data latch of each SRAM cell 302 may be used to store a single bit. The word line (WL) and bit line (BL) signals are used to control the operations of reading a bit from or writing a bit into the SRAM cell 302.

During a write operation, the bit line 310 and inverse bit line 312 may be set to opposite logic values according to the data that is to be written into the SRAM cell 302. When the SRAM cell 302 is selected, a logic high state may be applied to the word line (WL) 212 so that the data latch is selected to proceed to the write operation. As a result of a logic high pulse applied to the word line (WL) 212, the storage nodes 314, 316 of the data latch are connected to the bit lines 310, 312, and consequently the logic values at the bit lines 310, 312 are written into the respective storage nodes 314, 316 of the memory cell 302.

The upper and lower LCV write assist circuits 206, 208 utilize the same semiconductor layout as the memory cells 302. In this way, the LCV write assist circuits 206, 208 may be included within the same SRAM array column 300 as the memory bit cells 302. An example of a common semiconductor layout that may be used by the LCV write assist circuits 206, 208 and memory cells 302 is described below with reference to FIGS. 7-10.

The operation of the LCV write assist circuits 206, 208 to lower the SRAM core voltage (VDDAI) within the column 300 during write operations is illustrated in FIG. 3B. The LCV write assist circuits 206, 208 are both coupled to the VDDAI bus 210 and operate as voltage divider circuits to lower the VDDAI voltage during write operations. The SD signal 114 is tied low during normal device operations, as explained above with reference to FIG. 1B, causing the upper SRAM transistors 102, 104 of the LCV write assist circuits 206, 208 to connect Vdd 110 to the VDDAI bus 210. The LCV enable signal 118 transitions to a logic low state during write operations within the SRAM column 300, causing the lower SRAM transistors 106, 108 of the LCV write assist circuits 206, 208 to turn on. This creates a voltage divider between Vdd 110 and Vss 116 in each of the LCV write enable circuits 206, 208, and lowers the voltage on the VDDAI bus 112 by the voltage drop ($\Delta V$) across the SRAM transistors 102, 104, 106, 108, as shown in FIG. 3B.

Figure 4:
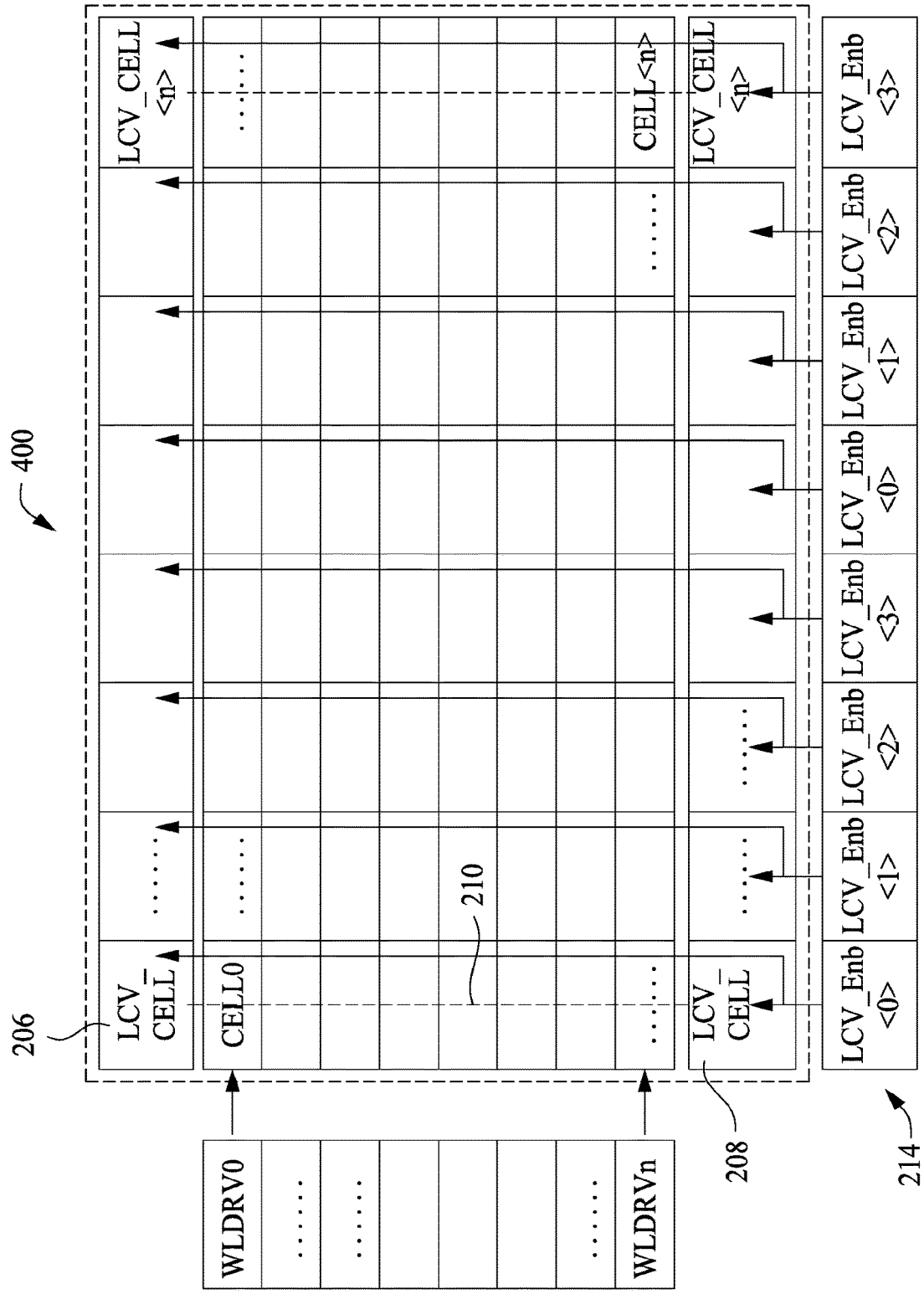
FIG. 4 is a floorplan diagram of another SRAM embodiment with included LCV write assist circuitry.

FIG. 4 is an example floorplan diagram of another SRAM embodiment 400 with included LCV write assist circuitry. This example 400 is similar to the embodiment described above with reference to FIG. 2, except that the LCV enable signal is provided to the LCV write assist circuits 206, 208 in a column-wise fashion. In this embodiment, a bit-write operation is utilized such that at a given point in time, the LCV enable signal 214 is applied to the desired columns and masked from the other columns. The LCV enable signal 214 can thus be selectively applied to one or more desired columns at any given time to lower the VDDAI bus 210 voltage.

In each column of the SRAM array, the LCV enable signal 214 is coupled to both of the LCV write assist circuits 206, 208 though a masking circuit (not shown) that is configured to mask the LCV enable signal 214 except during desired write operations. An example of a masking circuit 500 that may be utilized with the SRAM array layout 400 is illustrated in FIG. 5.

Figure 5:
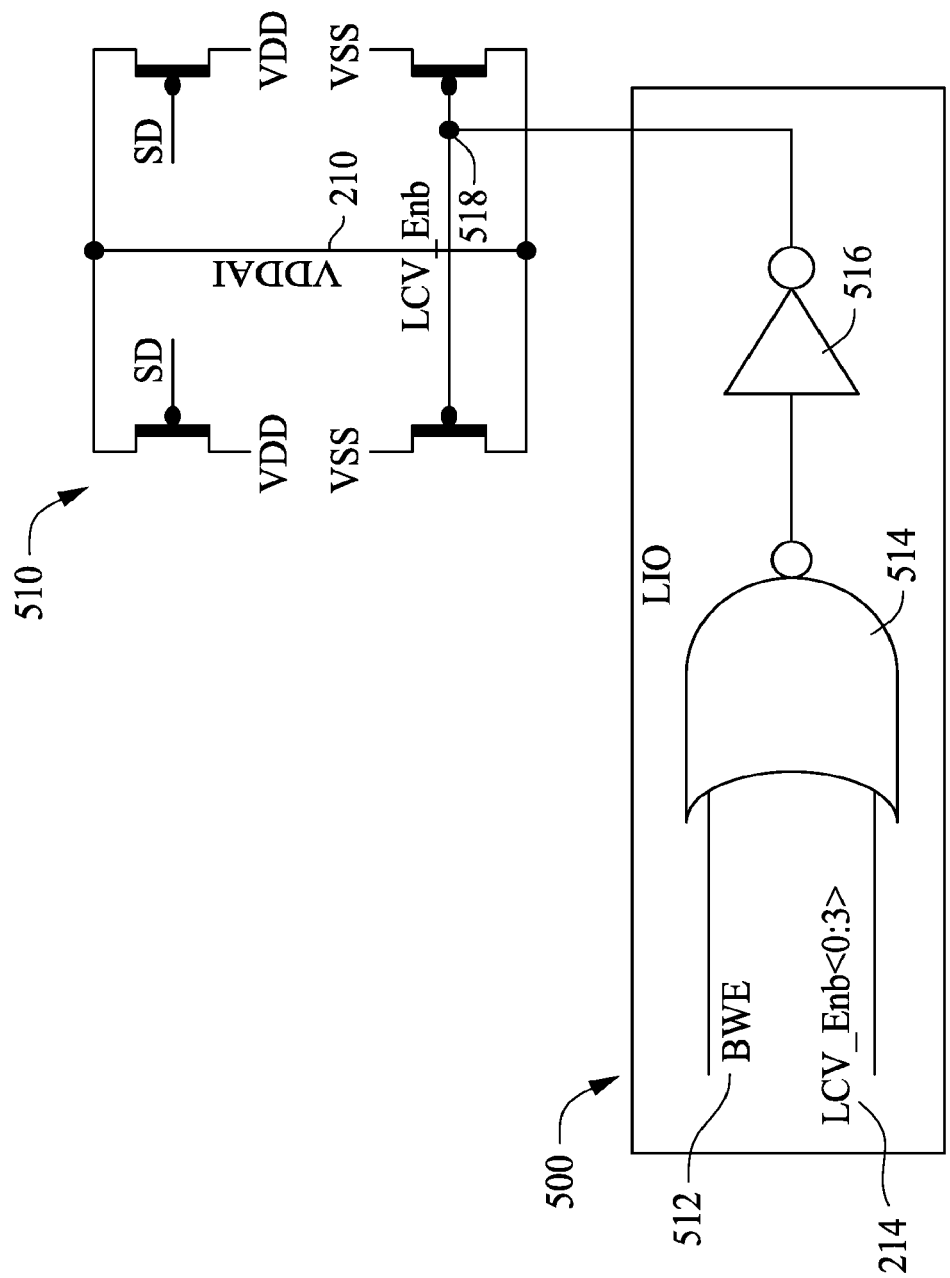
FIG. 5 shows an example of a masking circuit that may be utilized with the SRAM array layout of FIG. 4.

The masking circuit 500 in FIG. 5 is shown coupled to a single LCV write assist circuit 510 for simplicity, but could instead be coupled to multiple LVC write assist circuits within the same SRAM array column. The masking circuit 500 is a logic circuit that is configured to receive the LCV enable signal 214 and a bit-write enable signal (BWE) 512 and either pass or block the LCV enable signal 214 based on the logic state of the bit-write enable signal 512. Specifically, the illustrated embodiment includes a NOR gate 514 coupled in series with a logic inverter 516. In operation, the output 518 of the illustrated masking circuit 500 will only be in a logic low state if both the bit-write enable 512 and LCV enable 214 signals are in a logic low state. If either of the bit-write or LCV enable signals 512, 214 are in a logic high state, then the masking circuit output 518 will also be in a logic high state. Thus, a logic high state on the bit-write enable signal 512 will mask the LCV enable signal 214 from lowering the VDDAI bus voltage 210 in the LVC write assist circuit 510.

Figure 6:
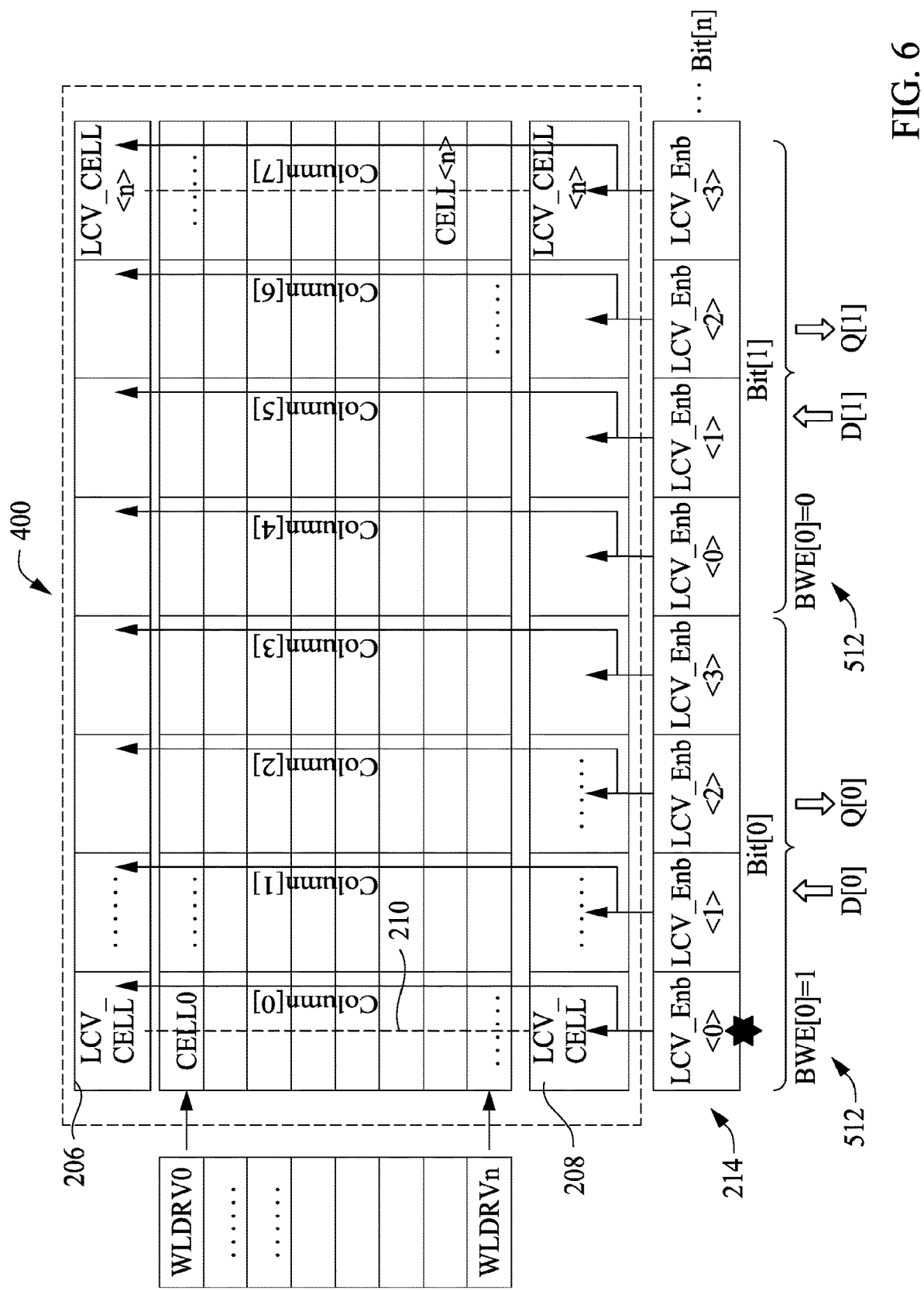
FIG. 6 is a diagram illustrating an example operation of the SRAM embodiment of FIGS. 4 and 5.

FIG. 6 is a diagram illustrating an example operation of the SRAM embodiment 400 shown in FIGS. 4 and 5. As explained above, the masking circuit 500 shown in FIG. 5 is used to select a single column of the array 400 for a write operation based on a bit-write enable signal (BWE) 512 and an LCV enable signal 214. In the example illustrated in FIG. 6, the first column 610 of the array (column [0]) is selected for a write operation.

It should be understood that the example shown in FIGS. 4-6 is a MUX-4 design, meaning that each bit (Bit[0]-Bit[n]) is selected from four columns of cells. In the example illustrated in FIG. 6, the first column from each bit is selected with the LCV enable signal 214. That is, the LCV_Enb <0> address is used to select the first column in each bit (i.e., Column[0] of Bit[0], Column[4] of Bit[1], etc.). The bit-write enable signal (BWE) 512 may be used to write to a column of a particular bit, while excluding writing to other bits. In the illustrated example, the bit-write enable signal (BWE) 512 is set to perform a write operation to Bit[0], but prohibit writing to Bit[1]. Specifically, BWE[0] is set to "1" to enable writing to Bit[0], and BWE[1] is set to "0" in order to prevent writing to Bit[1]. The LCV enable signal 214 may be used to select a particular column within the enabled bit (e.g., Column[0] of Bit[0] in the illustrated example.)

Figure 7:
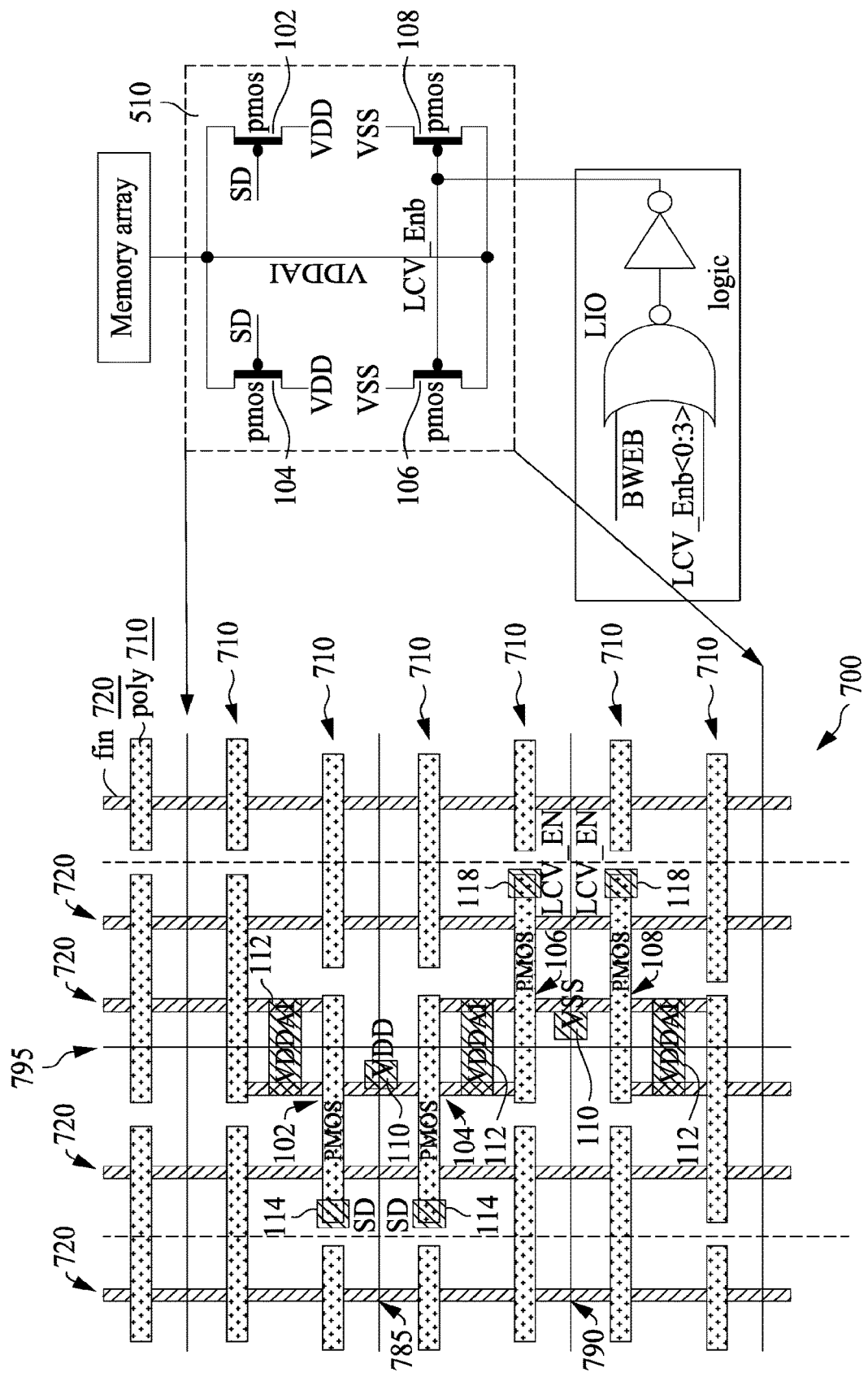
FIGS. 7 and 8 show an example LCV write assist circuit configured in an SRAM semiconductor layout.
Figure 8:
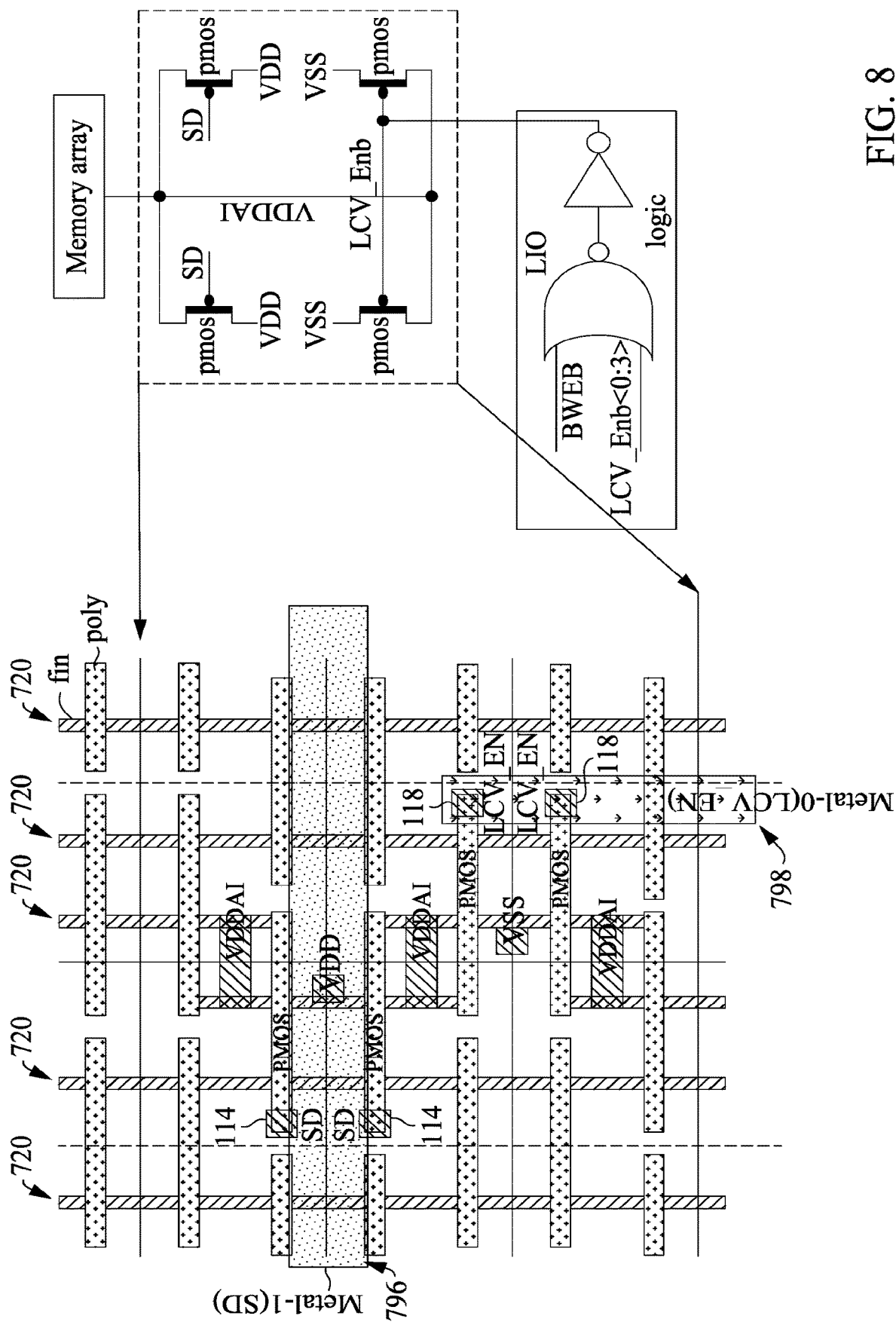
Figure 10:
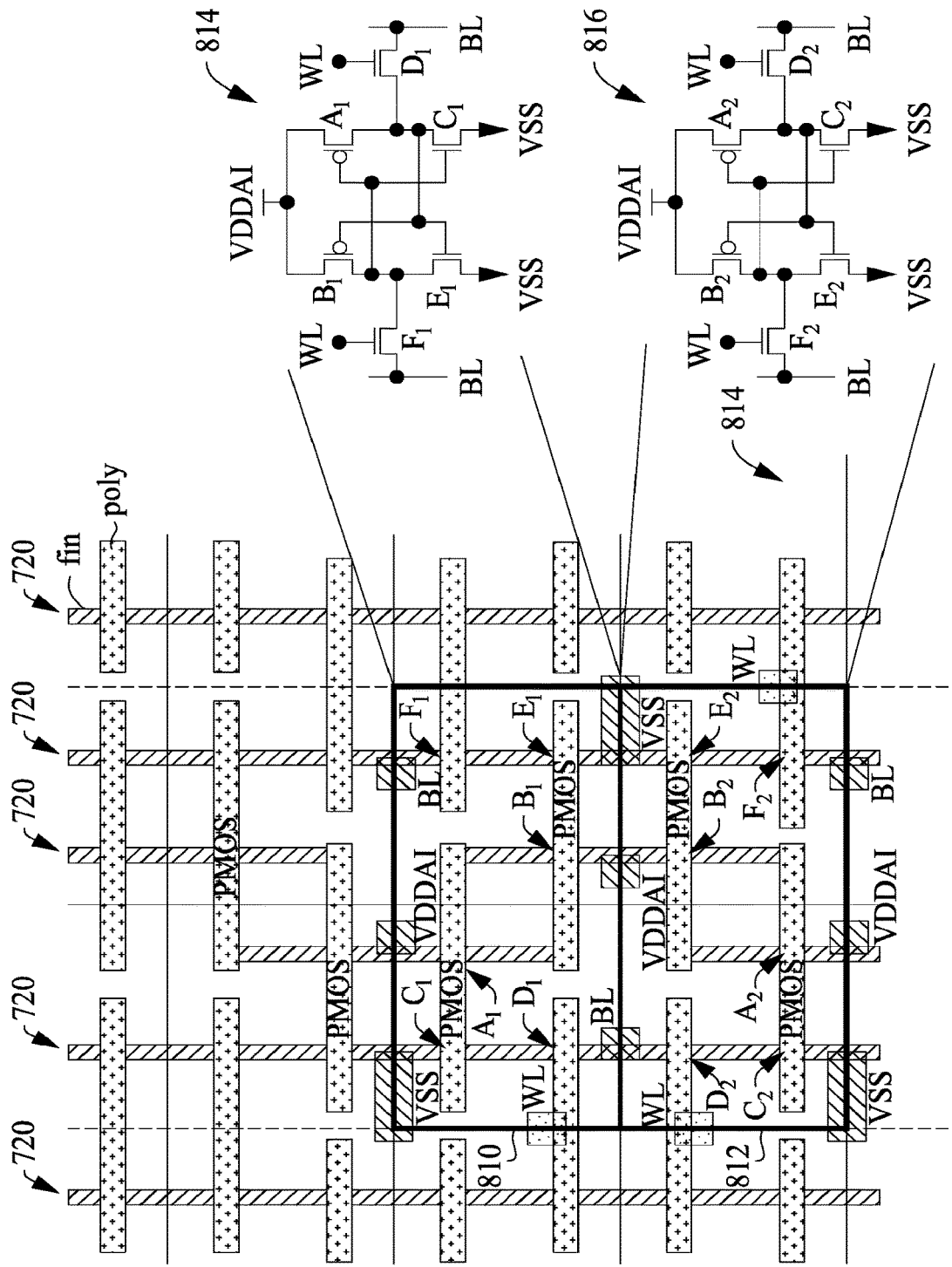
FIG. 10 shows an example of a six transistor (6T) SRAM memory bit cell layout.

FIGS. 7-10 illustrate an example of a common semiconductor layout utilized by both memory bit cells and LCV write assist circuitry in an SRAM array. FIGS. 7 and 8 show an example of how the LCV write assist circuitry 510 set forth in FIG. 5 may be implemented in an SRAM semiconductor layout 700. FIG. 9 shows an expanded view of the example SRAM semiconductor layout 700, illustrating how the semiconductor layout is common to both bit cells and LCV write assist circuitry within the overall SRAM array. FIG. 10 shows an example of a six transistor (6T) SRAM memory bit cell layout to further illustrate how the bit cells and LCV write assist circuitry may be implemented using a common SRAM transistor layout.

With reference first to FIG. 7, the example semiconductor layout 700 includes a plurality of intersecting gate (poly) regions 710 and fin-shaped active (fin) regions 720 that are used to form SRAM fin field effect transistors (FinFETs). Transistors are formed at the cross point of a gate region 710 and an active region 720. One non-limiting example of a FinFET structure for an SRAM device is disclosed in commonly-owned U.S. Patent Publication No. 2013/0292777. It should be understood, however, that the present disclosure is not limited to a particular transistor structure.

In the illustrated example, the SRAM semiconductor layout 700 is used to form the four transistors 102, 104, 106, 108 of the LCV write assist circuit 510. Corresponding reference numbers 102, 104, 106, 108 are used to illustrate the gate-active region cross points in the SRAM semiconductor layout 700 where each of the four transistors 102, 014, 016, 108 of the LCV write assist circuit are implemented. As illustrated, contact regions are included to connect the transistor gate regions to either the SD 114 or LVC_Enb 118 signals, and to connect the source and drain regions to either VDDAI 112, VDD 110 or VSS 116. As shown, the VDD 110, VSS 116 and VDDAI 112 lines may, for example, be provided by vertical connections to metal grid lines 785, 790, 795, respectively, within one or more layers of the semiconductor. Similarly, the SD 114 and LCV_Enb 118 signals may be provided by vertical connections to signal traces within one or more layers of the semiconductor. As an example, FIG. 8 illustrates signal traces 796, 798 that are respectively included on a "Metal-1" layer and a "Metal-0" layer of the semiconductor to provide the SD 114 and LCV_Enb 118 signals. The signal traces 796, 798 may, for example, be connected to the transistor gate regions 114, 118 by interlayer vias.

FIG. 9 shows an expanded view of the SRAM semiconductor layout 700. As shown in FIG. 9, the same semiconductor layout 700 is used for both an SRAM bit cell array 800 and for a plurality of LCV write assist circuits 802. The SRAM semiconductor layout 700 includes a repeating pattern of gate (poly) regions and active (fin) regions, and this same pattern of poly and fin regions is utilized by both the SRAM bit cell array 800 and the LCV write assist circuits 802. More specifically, in the illustrated example, the pattern of gate (poly) regions and active (fin) regions repeats every two rows in the vertical direction and every two columns in the horizontal direction. The illustrated example shows a bit cell 804 within a bit cell column 806 that receives its core voltage (VDDAI) 112 from a VDDAI grid line 795 controlled by an LCV write assist circuit 808 within the same SRAM bit cell column 806. As shown, the bit cell 804 utilizes the same semiconductor layout 700 (i.e., the same repeating pattern of poly and bit regions) as is used for the LCV write assist circuit 808.

In the illustrated example, each LCV write assist circuit 808 has a layout footprint that is equivalent to the layout footprint of three adjacent SRAM bit cells 804 within a bit cell column 806. For example, with reference to the LCV write assist circuit shown in FIG. 7, the four transistors 102, 104, 106, 108 are formed by the PMOS regions in a layout footprint equivalent to three SRAM bit cells formed in three adjacent rows. More specifically, transistor 102 is formed by a PMOS region in the equivalent layout footprint of a top bit cell, transistors 104 and 106 are formed by two PMOS regions in the equivalent layout footprint of a middle bit cell, and transistor 108 is formed by a PMOS region in the equivalent layout footprint of a bottom bit cell.

The example shown in FIG. 9 shows one LCV write assist circuit in each SRAM bit cell column for simplicity. Other examples, however, may include multiple LCV write assist circuits in each SRAM bit cell column. For example, LCV write assist circuits may be include at the top and bottom of each SRAM bit cell column, as shown in FIGS. 2 and 4.

FIG. 9 highlights one bit cell 804 within the array 800 for simplicity. It should be understood, however, that a bit cell array 800 includes multiple bit cells within each column, and may include many more rows and columns than shown in FIG. 9. It should also be understood that although a single row of LCV write assist circuits 802 is shown in FIG. 9, an SRAM array may include more than one row of LCV write assist circuits, for example as described above with reference to FIGS. 2 and 4.

FIG. 10 shows an example of a six transistor (6T) SRAM memory bit cell layout to further illustrate how the bit cells and LCV write assist circuitry may be implemented using a common SRAM transistor layout 700. Specifically, FIG. 10 illustrates an example SRAM transistor layout for two bit cells 810, 812 in a column of the array 800 shown on FIG. 9. Circuit diagrams 814, 816 of the two 6T SRAM memory bit cells 810, 812 are shown to the right of the example layout 700. The operation of the example 6T memory bit cells is described above with reference to FIG. 3A.

To help illustrate the transistor layouts 810, 812 for the two 6T SRAM memory bit cells 814, 816, FIG. 10 uses corresponding reference characters $A_1$-$F_1$ and $A_2$-$F_2$ for the SRAM transistors in the circuit diagrams 814, 816 and for the gate-active region cross points in the bit cells 810, 812 where each of the SRAM transistors are implemented in the SRAM semiconductor layout 700. For example circuit diagram 814 shows a PMOS transistor labeled $A_1$, and bit cell layout 810 shows that this transistor is laid out at the poly/fin cross point also labeled $A_1$.

Comparing FIGS. 7 and 10 shows that the LCV write assist circuit 510 in FIG. 7 is implemented using the same poly/fin layout as is used to implement the two example 6T SRAM memory bit cells 814, 816 in FIG. 10. More specifically, the same arrangement of gate (poly) and active (fin) regions are used throughout the entire SRAM semiconductor layout 700, including for both the array of SRAM memory bit cells and the LCV write assist circuits 510. In addition, as shown in FIG. 9, certain active (fin) regions may be shared across both the LVC write assist circuit(s) and memory bit cells within a column of the SRAM semiconductor layout 700

Figure 11:
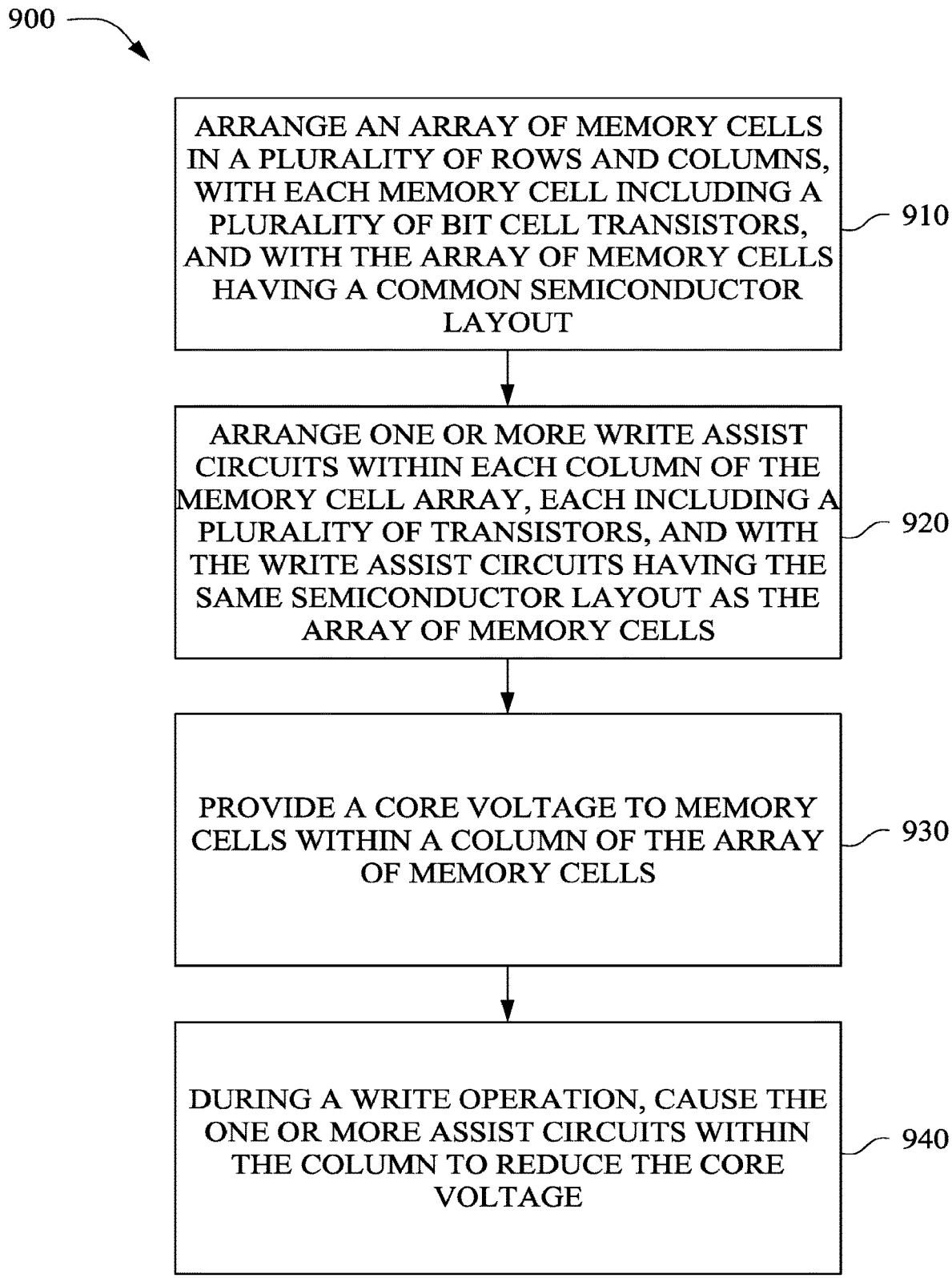
FIG. 11 is a flow diagram of an example method for fabricating and controlling a semiconductor memory device.

FIG. 11 is a flow diagram of an example method 900 for fabricating and controlling a semiconductor device. It is understood that the method of FIG. 11 is applicable to many different structures. But, the method is described with reference to structures of FIGS. 1-10 here to aid in understanding. At step 910, an array of memory cells (e.g., 200, 400) are arranged in a plurality of rows and columns, with each memory cell (e.g., 302) including a plurality of bit cell transistors (e.g., 308). The array of memory cells includes a common semiconductor layout, for example as described above with reference to FIGS. 7-10. At step 920, a plurality of write assist circuits (e.g., 206, 208) are arranged to include one or more write assist circuits within each column of the array of memory cells, with each write assist circuit including a plurality of transistors (e.g., 102, 104, 106, 108). The plurality of write assist circuits utilize the same common semiconductor layout as the array of memory cells. For example, each of the plurality of write assist circuits may utilize a layout footprint of the common semiconductor layout that is equivalent to a footprint for three adjacent memory cells with a column of the array of memory cells. In an embodiment, the plurality of write assist circuit may each include four PMOS transistors fabricated using four PMOS regions in three rows of the layout footprint, where one of the four PMOS transistors is fabricated in a top row, two of the four PMOS transistors are fabricated in a middle row, and another one of the four PMOS transistors is fabricated in a bottom row. Each write assist circuit (e.g., 206, 208) is configured to provide a core voltage (e.g., 210) to memory cells (e.g., 302) within the same column and to reduce the core voltage (e.g., 210) during a write operation. At step 930, a core voltage (e.g., 210) is provided to memory cells (e.g., 302) within a column of the array of memory cells (e.g., 200, 400). Then at step 940, during a write operation within the column, the one or more write assist circuit (e.g., 206, 208) reduce the core voltage.

In one embodiment of the disclosure, a semiconductor memory device includes an array of memory cells arranged in a plurality of rows and columns, with each memory cell including a plurality of bit cell transistors. The semiconductor memory device further includes a plurality of write assist circuits, including one or more write assist circuits within each column of the array of memory cells, each write assist circuit configured to provide a core voltage to memory cells within the same column and to reduce the core voltage during a write operation. The array of memory cells and the plurality of write assist circuits have a common semiconductor layout that includes a repeating pattern of gate regions and active regions, where each of the plurality of write assist circuits utilizes a layout footprint of the common semiconductor layout that is equivalent to a footprint for three adjacent memory cells within a column of the array of memory cells.

In one embodiment of the disclosure, a write assist circuit for a semiconductor memory device includes a core voltage bus configured to provide power to memory cells within the semiconductor memory device. The write assist circuit further includes a first pair of transistors coupled between a pull-up voltage and the core voltage bus, and a second pair of transistors coupled between a pull-down voltage and the core voltage bus, the second pair of transistors each having a gate terminal that receives an enable signal that causes the second pair of transistors to connect the core voltage bus to the pull-down voltage during write operations. The write assist circuit and the memory cells have a common semiconductor layout that includes a repeating pattern of gate regions and active regions, where the write assist circuit utilizes a layout footprint of the common semiconductor layout that is equivalent to a footprint for three adjacent memory cells.

In one embodiment of the disclosure, a method of controlling a semiconductor memory device that includes an array of memory cells arranged in a plurality of rows and columns and one or more write assist circuits within each column of the array of memory cells, includes the following operations. Providing a core voltage to memory cells within a column of the array of memory cells. During a write operation, causing the one or more write assist circuits in the column to reduce the core voltage. The one or more write assist circuits and memory cells have a common static random access memory (SRAM) semiconductor layout that includes a repeating pattern of gate regions and active regions, where the one or more write assist circuits utilize a layout footprint of the common semiconductor layout that is equivalent to a footprint for three adjacent memory cells within the column of the array of memory cells.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. For example, the illustrated embodiments include six transistor (6T) SRAM cells, but other embodiments could include other SRAM configurations.

What is claimed is:

1. A semiconductor memory device, comprising:
   an array of memory cells arranged in a column; and
   a write assist circuit within the column of the array of memory cells, the array of memory cells and the write assist circuit having a common semiconductor layout, wherein the common semiconductor layout includes a repeating pattern of gate regions and active regions every two rows in a vertical direction and every two columns in a horizontal direction.

2. The device of claim 1, wherein each memory cell includes a plurality of bit cell transistors.

3. The device of claim 2, wherein the plurality of bit cell transistors and the plurality of write assist circuits are each fabricated using common design rules for static random access memory (SRAM) transistors.

4. The device of claim 2 wherein a common fin structure is shared across the one or more write assist circuits and bit cell transistors within each column of the array of memory cells.

5. The device of claim 1, wherein each write assist circuit is configured to provide a core voltage to memory cells within the same column and to reduce the core voltage during a write operation.

6. The device of claim 1, wherein the common semiconductor layout includes a repeating pattern of gate regions and active regions.

7. The device of claim 1, wherein the plurality of write assist circuits each include four PMOS transistors fabricated using four PMOS regions in three rows of the layout footprint, wherein one of the four PMOS transistors is fabricated in a top row, two of the four PMOS transistors are fabricated in a middle row, and another one of the four PMOS transistors is fabricated in a bottom row.

8. The device of claim 1, wherein the plurality of write assist circuits are disposed adjacent to the array of memory cells such that there is no buffer area between the array of memory cells and the plurality of write assist circuits.

9. The device of claim 1, wherein the plurality of write assist circuits each include,
a first pair of transistors coupled between a pull-up voltage and the a core voltage bus, and
a second pair of transistors coupled between a pull-down voltage and the core voltage bus, the second pair of transistors each having a gate terminal that receives an enable signal that causes the second pair of transistors to connect the core voltage bus to the pull-down voltage during write operations.

10. The device of claim 9, wherein the first pair of transistors each include a gate terminal that receives a shut-down signal, the shut-down signal causing the first pair of transistors to disconnect the core voltage bus from the pull-up voltage during a shut-down operation.

11. A write assist circuit for a semiconductor memory device, comprising:
a voltage bus configured to provide power to memory cells within the semiconductor memory device;
a first pair of transistors coupled between a first voltage and the voltage bus;
a second pair of transistors coupled between a second voltage and the voltage bus;
the write assist circuit and the memory cells having a common semiconductor layout, wherein the common semiconductor layout includes a repeating pattern of gate regions and active regions every two rows in a vertical direction and every two columns in a horizontal direction.

12. The circuit of claim 11, wherein the second pair of transistors each has a gate terminal that receives an enable signal that causes the second pair of transistors to connect the core voltage bus to the pull-down voltage during write operations to the memory cells.

13. The circuit of claim 11, wherein the common semiconductor layout includes a repeating pattern of gate regions and active regions.

14. The circuit of claim 11, wherein a first common fin structure is shared across the first pair of transistors and the memory cells, and a second common fin structure is shared across the second pair of transistors and the memory cells.

15. The circuit of claim 11, wherein the first pair of transistors each include a gate terminal that receives a shut-down signal, the shut-down signal causing the first pair of transistors to disconnect the core voltage bus from the pull-up voltage during a shut-down operation.

16. The circuit of claim 11, wherein the core voltage bus is configured to provide power to one column of memory cells within an array of memory cells within the semiconductor memory device.

17. A method of controlling a semiconductor memory device that includes an array of memory cells arranged in a column and a write assist circuit within the column, the method comprising:
providing a core voltage to memory cells within the column; and
wherein a common semiconductor layout includes a repeating pattern of gate regions and active regions every two rows in a vertical direction and every two columns in a horizontal direction.

18. The method of claim 17, further comprising:
during a write operation, causing the one or more write assist circuits in the column to reduce the core voltage.

19. The method of claim 17, wherein the common SRAM semiconductor layout includes a repeating pattern of gate regions and active regions.

20. The method of claim 17, further comprising,
providing an enable signal that causes the one or more write assist circuits to connect a core voltage bus to a pull-down voltage during the write operation.

* * * * *